United States Patent
He et al.

(10) Patent No.: US 11,726,863 B2
(45) Date of Patent: Aug. 15, 2023

(54) MEMORY DATA CORRECTION USING MULTIPLE ERROR CONTROL OPERATIONS

(71) Applicant: Micron Technology, Inc., Boise, ID (US)

(72) Inventors: Deping He, Boise, ID (US); Qing Liang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/725,226

(22) Filed: Apr. 20, 2022

(65) Prior Publication Data

US 2022/0308955 A1    Sep. 29, 2022

Related U.S. Application Data

(63) Continuation of application No. 16/996,305, filed on Aug. 18, 2020, now Pat. No. 11,314,583.

(51) Int. Cl.
| | |
|---|---|
| *G06F 11/00* | (2006.01) |
| *G06F 11/07* | (2006.01) |
| *G11C 16/26* | (2006.01) |
| *G11C 16/04* | (2006.01) |

(52) U.S. Cl.
CPC ...... *G06F 11/0793* (2013.01); *G06F 11/0727* (2013.01); *G06F 11/0751* (2013.01); *G11C 16/0483* (2013.01); *G11C 16/26* (2013.01)

(58) Field of Classification Search
CPC ............ G06F 11/0793; G06F 11/0727; G06F 11/0751
USPC .......................................................... 714/1–57
See application file for complete search history.

(56) References Cited

U.S. PATENT DOCUMENTS

| | | | |
|---|---|---|---|
| 5,964,887 | A | 10/1999 | Conseil |
| 10,108,481 | B1 * | 10/2018 | Kataria ............... G06F 11/0793 |
| 2007/0260911 | A1 | 11/2007 | Marilly et al. |
| 2008/0040531 | A1 | 2/2008 | Anderson |
| 2008/0209277 | A1 | 8/2008 | Sasazaki |
| 2010/0287413 | A1 | 11/2010 | Potkonjak |
| 2011/0055636 | A1 | 3/2011 | Dehaan et al. |
| 2013/0185598 | A1 | 7/2013 | Haratsch et al. |
| 2013/0212436 | A1 | 8/2013 | Zhu et al. |
| 2013/0290793 | A1 * | 10/2013 | Booth ................. G06F 11/1048 714/54 |
| 2014/0059396 | A1 * | 2/2014 | Matsuyama ............ G06F 12/00 714/54 |

(Continued)

*Primary Examiner* — Sarai E Butler
(74) *Attorney, Agent, or Firm* — Holland & Hart LLP

(57) ABSTRACT

Methods, systems, and devices for memory data correction using multiple error control operations are described. A single command may be received to correct an error detected in data stored by a memory array. A first error control operation and a second error control operation may be implemented based on the single command. The first error control operation may be performed on the data stored by the memory array using one or more different reference voltages to read the data. The error may be determined to remain in the data after performing the first error control operation. The second error control operation may then be performed on the data stored by the memory array. The second error control operation may use one or more voltage distributions associated with the memory cells of the memory array.

20 Claims, 6 Drawing Sheets

(56) References Cited

U.S. PATENT DOCUMENTS

| | | | |
|---|---|---|---|
| 2015/0052387 A1* | 2/2015 | Kern | G11C 29/50004 |
| | | | 714/6.13 |
| 2015/0058662 A1 | 2/2015 | Yang et al. | |
| 2015/0193299 A1 | 7/2015 | Hyun et al. | |
| 2016/0042797 A1* | 2/2016 | Kim | G11C 16/3427 |
| | | | 714/764 |
| 2016/0098216 A1 | 4/2016 | Huang et al. | |
| 2017/0308438 A1* | 10/2017 | Yim | G11C 16/26 |
| 2019/0130967 A1* | 5/2019 | Danjean | G11C 11/5642 |
| 2020/0027503 A1* | 1/2020 | Chen | G06F 3/0632 |
| 2020/0142590 A1 | 5/2020 | Chew et al. | |
| 2020/0159447 A1 | 5/2020 | Luo et al. | |

\* cited by examiner

MEMORY DATA CORRECTION USING MULTIPLE ERROR CONTROL OPERATIONS

CROSS REFERENCE

The present Application for Patent is a continuation of U.S. patent application Ser. No. 16/996,305 by He et al., entitled "MEMORY DATA CORRECTION USING MULTIPLE ERROR CONTROL OPERATIONS," filed Aug. 18, 2020, assigned to the assignee hereof, and is expressly incorporated by reference in its entirety herein.

BACKGROUND

The following relates generally to one or more memory systems and more specifically to memory data correction using multiple error control operations.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Some memory systems have two or more different error control commands that can be issued by a host system. To use the different error control commands, the host system may track a variety of parameters and then determine which error control command to issue. Handling two or more different error handling procedures, however, can complicate the performance of a host system.

Systems, devices, and techniques are described for a single error control command issued by host system that initiates a procedure that can include two or more error control procedures. Upon receiving the single error control command, the memory system may initiate one or more first error control procedures. If the error persists, the memory system may initiate one or more second error control procedures based on the single command (e.g., without receiving or without needing to receive a second error control command).

Features of the disclosure are initially described in the context of systems and dies as described with reference to FIG. 1. Features of the disclosure are described in the context of a voltage distribution graph and a flow diagram as described with reference to FIGS. 2 and 3. These and other features of the disclosure are further illustrated by and described with reference to an apparatus diagram and flowcharts that relate to memory data correction using multiple error control operations as described with reference to FIGS. 4-6.

Figure 1:
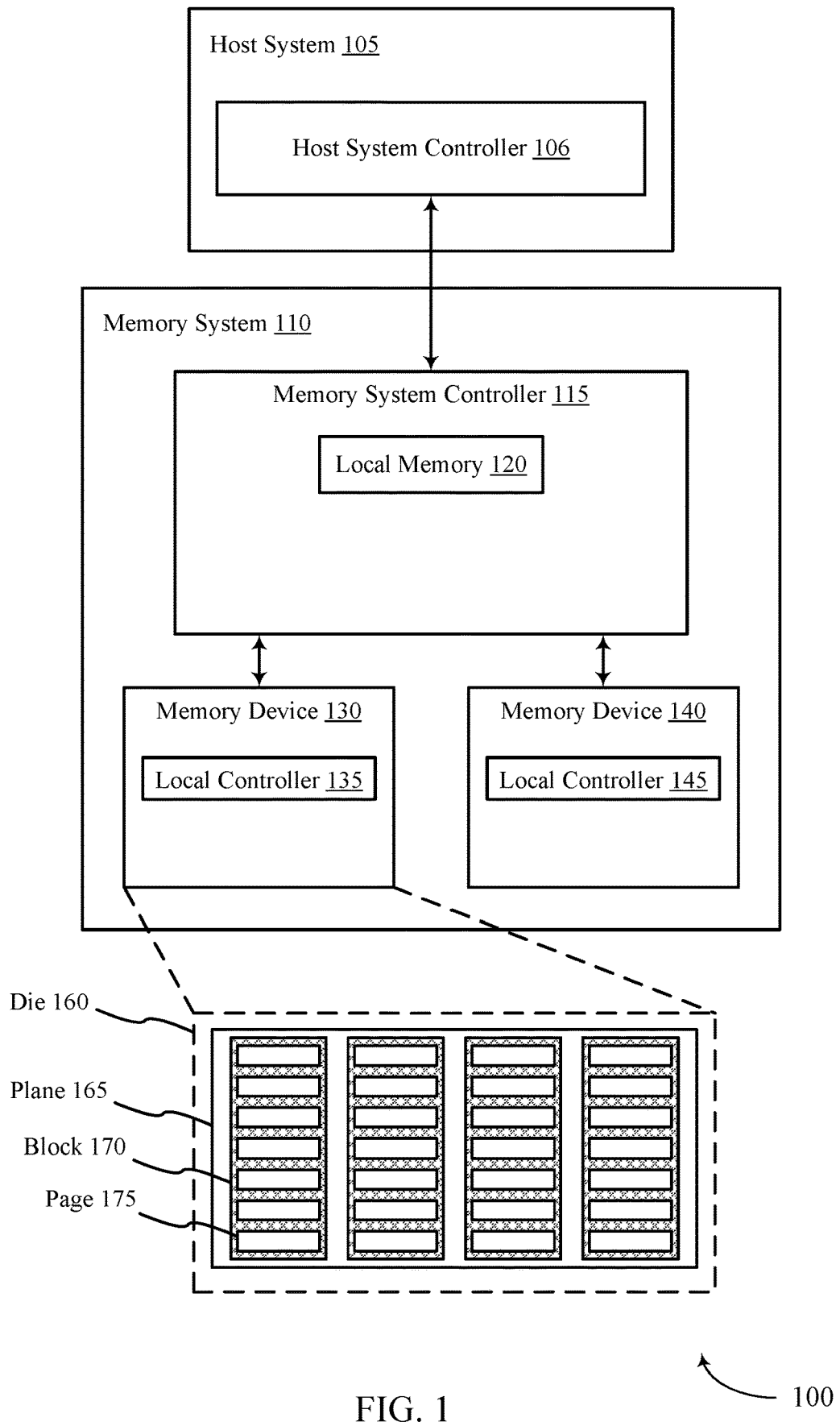
FIG. 1 illustrates an example of a system that supports memory data correction using multiple error control operations in accordance with examples as disclosed herein.

FIG. 1 is an example of a system 100 that supports memory data correction using multiple error control operations in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Although one memory system 110 is shown in FIG. 1, it is to be understood that the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a serial advanced technology attachment (SATA) interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open NAND Flash Interface (ONFI), Low Power Double Data Rate (LPDDR). In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 or memory device 140 included in the memory system 110, or via a respective physical host interface for each type of memory device 130 or memory device 140 included in the memory system 110.

Memory system 110 may include a memory system controller 115, a memory device 130, and a memory device 140. A memory device 130 may include one or more memory arrays of a first type of memory cells (e.g., a type of non-volatile memory cells), and a memory device 140 may include one or more memory arrays of a second type of memory cells (e.g., a type of volatile memory cells). Although one memory device 130 and one memory device 140 are shown in the example of FIG. 1, it is to be understood that memory system 110 may include any quantity of memory devices 130 and memory devices 140, and that, in some cases, memory system 110 may lack either a memory device 130 or a memory device 140.

The memory system controller 115 may be coupled with and communicate with the host system 105 (e.g., via the physical host interface), and may be an example of a control component configured to cause the memory system 110 to perform various operations in accordance with examples as described herein. The memory system controller 115 may also be coupled with and communicate with memory devices 130 or memory devices 140 to perform operations such as reading data, writing data, erasing data, or refreshing data at a memory device 130 or a memory device 140, and other such operations, which may generically be referred to as access operations. In some cases, the memory system controller 115 may receive commands from the host system 105 and communicate with one or more memory devices 130 or memory devices 140 to execute such commands (e.g., at memory arrays within the one or more memory devices 130 or memory devices 140). For example, the memory system controller 115 may receive commands or operations from the host system 105 and may convert the commands or operations into instructions or appropriate commands to achieve the desired access of the memory devices 130 or memory devices 140. And in some cases, the memory system controller 115 may exchange data with the host system 105 and with one or more memory devices 130 or memory devices 140 (e.g., in response to or otherwise in association with commands from the host system 105). For example, the memory system controller 115 may convert responses (e.g., data packets or other signals) associated with the memory devices 130 or memory devices 140 into corresponding signals for the host system 105.

The memory system controller 115 may be configured for other operations associated with the memory devices 130 or memory devices 140. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130 or memory devices 140.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored to the local memory 120 when read from or written to a memory device 130 or memory device 140, and may be available within the local memory 120 for subsequent retrieval for or manipulation (e.g., updating) by the host system 105 (e.g., with reduced latency relative to a memory device 130 or memory device 140) in accordance with a cache policy.

Although the example of memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135 or local controllers 145, which may be internal to memory devices 130 or memory devices 140, respectively, to perform the functions ascribed herein to the memory system controller 115. In general, one or more functions ascribed herein to the memory system controller 115 may in some cases instead be performed by the host system 105, a local controller 135, or a local controller 145, or any combination thereof.

A memory device 140 may include one or more arrays of volatile memory cells. For example, a memory device 140 may include random access memory (RAM) memory cells, such as dynamic RAM (DRAM) memory cells and synchronous DRAM (SDRAM) memory cells. In some examples, a memory device 140 may support random access operations (e.g., by the host system 105) with reduced latency relative to a memory device 130, or may offer one or more other performance differences relative to a memory device 130.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 130 or a memory device 140 may include (e.g., on a same die or within a same package) a local controller 135 or a local controller 145, respectively, which may execute operations on one or more memory cells of the memory device 130 or the memory device 140. A local controller 135 or a local controller 145 may operate in conjunction with a memory system controller 115 or may perform one or more functions ascribed herein to the memory system controller 115. In some cases, a memory device 130 or a memory device 140 that includes a local controller 135 or a local controller 145 may be referred to as a managed memory device and may include a memory array and related circuitry combined with a local (e.g., on-die or in-package) controller (e.g., local controller 135 or local controller 145). An example of a managed memory device is a managed NAND (MNAND) device.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support memory data correction using multiple error control operations. For example, the host system 105, the memory system controller 115, a memory device 130, or a memory device 140 may include or otherwise may access one or more non-transitory computer readable media storing instructions (e.g., firmware) for performing the functions ascribed herein to the host system 105, memory system controller 115, memory device 130, or memory device 140. For example, such instructions, when executed by the host system 105 (e.g., by the host system controller 106), by the memory system controller 115, by a memory device 130 (e.g., by a local controller 135), or by a memory device 140 (e.g., by a local controller 145), may cause the host system 105, memory system controller 115, memory device 130, or memory device 140 to perform one or more associated functions as described herein.

Figure 2:
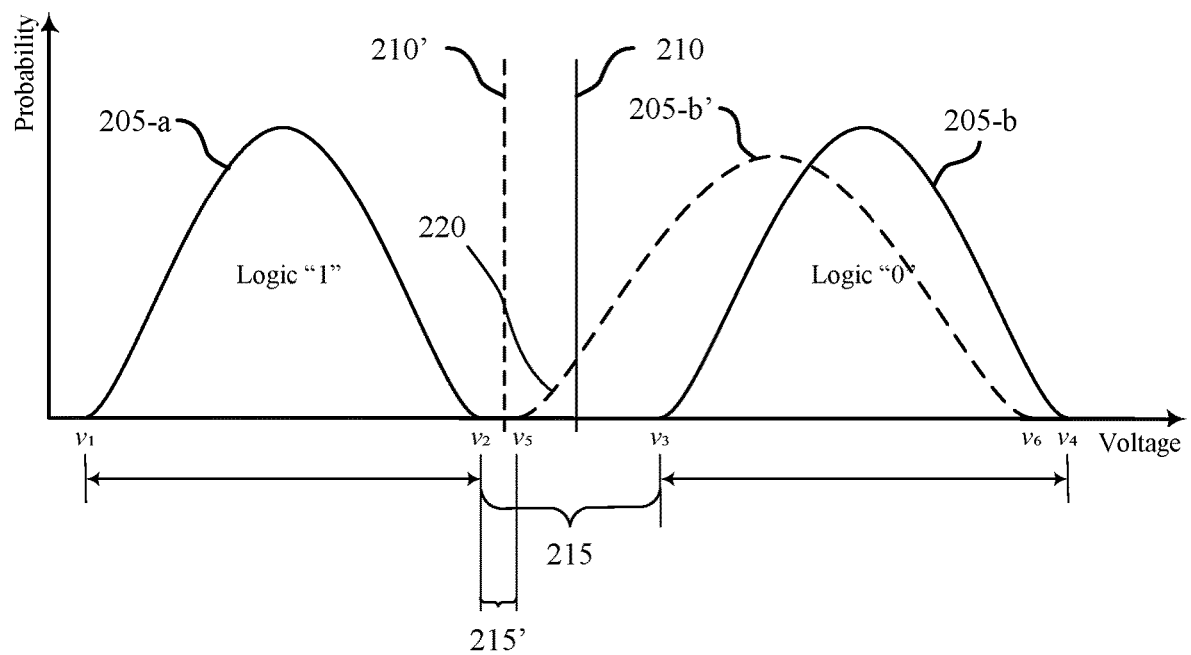
FIG. 2 illustrates an example of a voltage distribution graph that supports techniques for data programming in accordance with examples as disclosed herein

FIG. 2 illustrates an example of a voltage distribution plot 200 that supports memory data correction using multiple error control operations in accordance with examples as disclosed herein. The voltage distribution plot 200 illustrates a voltage distribution 205-a that may be associated with a signal output by a memory cell storing a logic value '1' and a voltage distribution 205-b that may be associated with a signal output by a memory cell storing a logic value '0.' The voltage distribution of the memory cell may include voltage distribution 205-a corresponding to logic value '1' and bounded by data threshold values v1 and v2, and voltage distribution 205-*b* corresponding to logic value '0' and bounded by data threshold values v3 and v4. A valley 215 may occur between voltage distributions 205-*a* and 205-*b*. The voltage distribution plot 200 also illustrates a reference voltage 210 in the valley 215. In some cases, a memory system may perform one or more read operations on a set of memory cells, each using a different reference voltage 210. The voltage distribution plot 200 shows distributions for an SLC memory device. The principles described herein may be applied for memory devices that use MLC, TLC, QLC or other types of memory operations.

During a read operation, a memory array may output a set of signals based on the logic values stored by the set of accessed memory cells. For example, if a logic value '1' has been stored in a memory cell, the memory cell may output a voltage between data threshold values v1 and v2. Similarly, if a memory cell has been stored with a logic value '0', the memory cell may output a voltage between data threshold values v3 and v4.

To determine the logic value that is stored in a memory cell, a sense amplifier may receive the signal (i.e., voltage level) from the memory cell and may compare the signal with reference voltage 210. If the signal value is less than the reference voltage, the sense amplifier may determine that the memory cell represents a logic value '1'. Similarly, if the signal value is greater than the reference voltage, the sense amplifier may determine that the signal represents a logic value '0'. The sense amplifier may output a codeword including a set of bits each associated with one of the memory cells of the set of accessed memory cells.

In the example of voltage distribution plot 200, if a memory cell storing a logic value '1' outputs a signal with a voltage less than the reference voltage 210 (e.g., within voltage distribution 205-*a*) and a read operation is performed using the reference voltage 210, the sense amplifier may output a bit having a logic value '1.' Additionally, if a memory cell storing a logic value '0' outputs a signal with a voltage greater than the reference voltage 210 (e.g., within voltage distribution 205-*b*) and a read operation is performed using the reference voltage 210, the sense amplifier may output a bit having a logic value '0'.

In other examples, the logic values may be reversed so that the sense amplifier may instead determine a logic value '0' if the signal value is less than the reference voltage 210 and a logic value '1' if the signal value is greater than the reference voltage 210.

There may be times when one or more of the voltage distributions of a memory cell may change, e.g., due to age, voltage spikes, etc. Either or both of the voltage distributions may expand, shift, etc. Because the signal value of the memory cell may be compared with a reference voltage (e.g., a static reference signal), the data represented by the memory cell may not be affected by the change as long as the voltage distributions corresponding to logic values '0' and '1' remain on opposite sides of the reference voltage. For example, voltage distribution 205-*a* or 205-*b* or both may shift and/or expand with respect to voltage without causing data problems if they both remain on opposite sides of reference voltage 210.

But if any portion of either voltage distribution crosses over the reference voltage so as to be on the same side of the reference voltage line as the other voltage distribution, data errors may occur. For example, if voltage distribution 205-*b* shifts and expands to voltage distribution 205-*b'* (shown in dashed line and bounded by data threshold values v5 and v6), the memory cell may output a voltage between v5 and v6 if the memory cell has a logic value '0' stored therein. So the portion 220 of voltage distribution 205-*b'* between v5 and reference voltage 210 becomes positioned on the same side of reference voltage 210 as voltage distribution 205-*a*. As a result, if a memory cell stored with a logic '0' outputs a signal within the portion 220 of voltage distribution 205-*b'*, the sense amplifier may erroneously determine that the memory cell represents a logic value '1' because the signal value is less that the reference voltage 210.

To correct the data error, the memory system may shift the reference voltage. For example, reference voltage 210 may be shifted to reference voltage 210' within valley 215' so that the portion 220 of voltage distribution 205-*b'* is no longer on the same side of the reference voltage as voltage distribution 205-*a*. If reference voltage 210' is then used during a read operation, the sense amplifier may determine that any signal value within voltage distribution 205-*b'* (including the portion 220) represents a logic value '0'.

The new value for the reference voltage may be determined in different manners. In one example, the reference voltage may be incremented or decremented in steps, from the original reference voltage or another voltage, until a value is reached that produces no errors when used to read the memory cells. In one example, the voltage distributions of the memory cells may be analyzed to determine the valley between the voltage distribution levels and then setting the reference voltage to be within the valley. In some cases, the reference voltage may then be incremented or decremented in steps if the reference voltage within the valley if the error persists. Other types of error control may also be possible.

Figure 3:
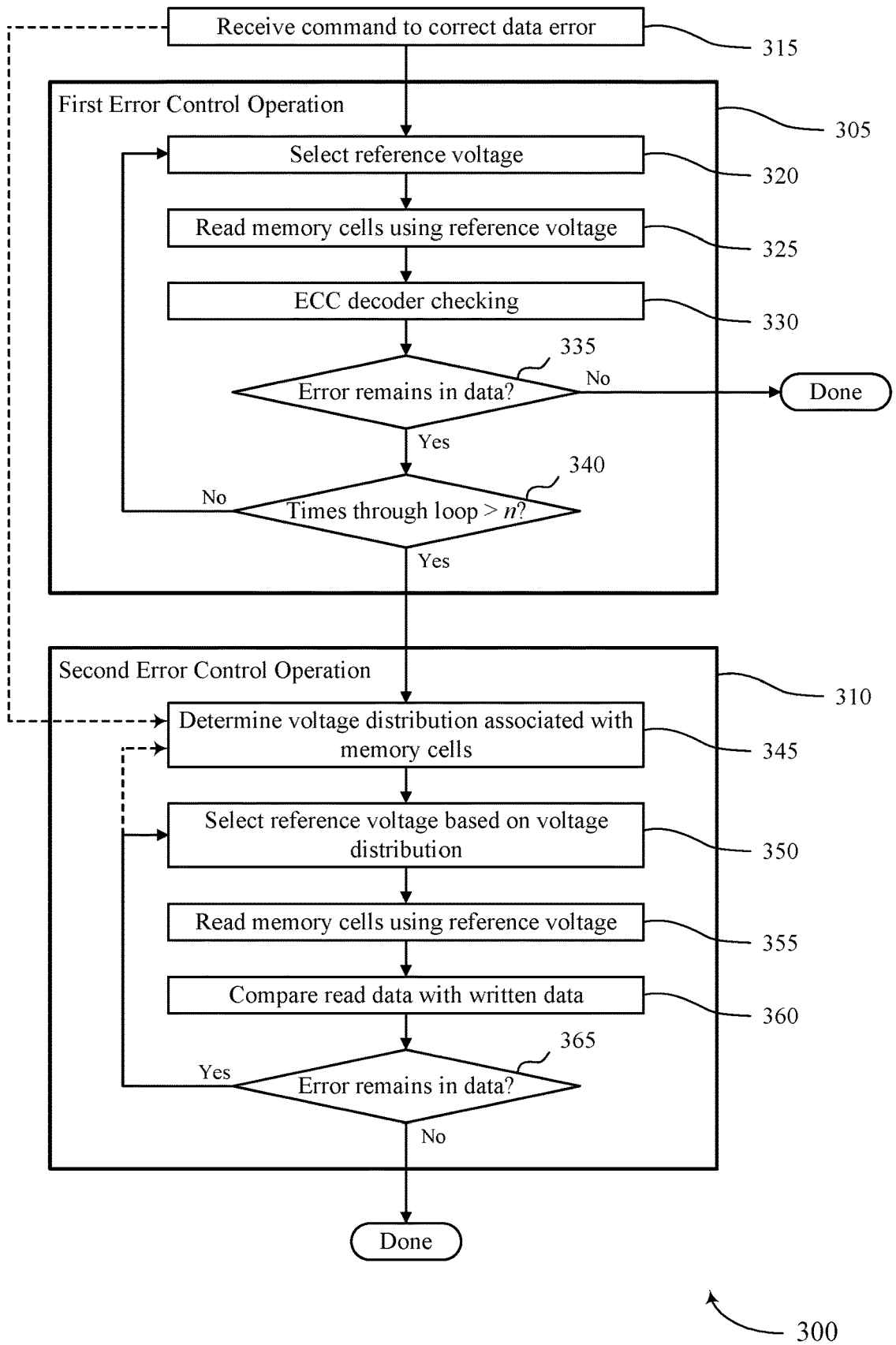
FIG. 3 illustrates an example of a flow diagram that supports memory data correction using multiple error control operations in accordance with examples as disclosed herein.

FIG. 3 illustrates an example of a flow diagram illustrating a method 300 that supports memory data correction using multiple error control operations in accordance with examples as disclosed herein. The operations of method 300 may be implemented by a memory system or its components as described herein. For example, the operations of method 300 may be performed by a memory system as described with reference to FIG. 4. In some examples, a memory system may execute a set of instructions to control the functional elements of the memory system to perform the described functions. Additionally or alternatively, a memory system may perform aspects of the described functions using special-purpose hardware.

Using method 300, a single error control command may be issued by a host system to initiate a procedure that can include two or more error control procedures. Upon receiving the single error control command, the memory system may initiate a first error control procedure. If the error persists, the memory system may initiate a second error control procedure based on the single command (e.g., without receiving or without needing to receive a second error control command).

Method 300 may include a first error control operation 305 and a second error control operation 310. In some cases, first error control operation 305 may include a read retry operation. A read retry operation may use different read options that may be stored internally inside the memory system for a page read. For each retry, the reference voltage used to read the memory location may be increased or decreased by a set value. In some cases, second error control operation 310 may be an example of a recovery operation that calibrates the reference voltage based on voltage distributions of the memory cells (e.g., an auto read calibration operation). The second error control operation 310 may find the valley between voltage distribution levels by analyzing the data threshold distributions of a page. An optimal read level may occur at the valley. More information about data threshold distributions is given above with reference to FIG.

2. The second error control operation 310 may be performed "with persistence" or "without persistence." When performed "with persistence," the second error control operation 310 may be a onetime operation, allowing only one shift of the reference voltage used to read the memory location. When performed "with persistence," the second error control operation 310 may be a repeating operation, allowing shifting of the reference voltage to continue until the error goes away. Both types of the second error control operation 310 may be used in method 300.

In method 300, first error control operation 305 may include one or more of steps 320 through 340 and second error control operation 310 may include one or more of steps 345 through 365. As shown in FIG. 3, method 300 may flow from first error control operation 305 to second error control operation 310.

At 315, a command to correct a data error may be received. In some cases, the command may be a single command to correct an error detected in data stored in a memory array. The single command may include a single opcode that is configured to optionally implement two or more error control operations. The command may include a memory address value indicating the location within the memory array in which the data error has occurred and/or a data value written to the memory array location. In some cases, the command may be a read recovery command, such as an address cycle read retry operation. In some cases, the memory system may receive the command from a source external to the memory system, such as a host device or a memory controller.

In some cases, the command may be an example of read command that includes one or more indexes to indicate what various error control operations may be performed to retrieve the correct data. In such examples, a single index may initiate one or more error recovery operations. Some indexes may be configured to initiate the first error control operation 305, a plurality of instances of the first error control operation 305, the second error control operation 310, a plurality of instances of the second error control operation 310, both the first error controller operation 305 and the second error control operation 310, any quantity of instances of the first error controller operation 305 or the second error control operation 310, or any combination thereof. As such, the command may result in performing the first error control operation 305, performing the second error control operation 310, or a combination thereof. Table 1 shows a various indexes associated with various error control operations. Indexes RR0-RR8 may reference error control operations that are examples of the first error control operation 305, which may be examples of read retry operations, and indexes RR10-RR11 may reference error control operation that are examples of the second error control operation 310, which may be examples a recovery operation that calibrates the reference voltages based on distributions of memory cells. Having a single index (e.g., RR11) that is associated with three different error control operations (albeit similar in type), may be an example of how a single index can indicate multiple error control operations and thereby simplify an interface with a host system.

TABLE 1

| Error Control Operation | Index |
| --- | --- |
| First Error Control Operation 0 | RR0 |
| First Error Control Operation1 | RR1 |
| First Error Control Operation2 | RR2 |
| First Error Control Operation3 | RR3 |
| First Error Control Operation4 | RR4 |
| First Error Control Operation5 | RR5 |
| First Error Control Operation6 | RR6 |
| First Error Control Operation7 | RR7 |
| First Error Control Operation8 | RR8 |
| Second Error Control Operation without persistence | RR10 |
| Second Error Control Operation 0 with persistence | RR11 |
| Second Error Control Operation 1 with persistence | RR11 |
| Second Error Control Operation 2 with persistence | RR11 |

After receiving the command, the first error control operation 305 may be initiated. The first error control operation may include a first loop that includes one or more of steps 320 through 340. Each time through the first loop may include reading the data and comparing it with the written data using a specific reference voltage. Step 320 may be an entrance to the first loop. The first error control operation 305 may be an example of a read retry operation that uses one or more predetermined reference voltages to adjust a read operation to correct one or more errors in a codeword.

At 320, a reference voltage may be selected by the memory system. The first time through the first loop (e.g., when 320 is entered from 315), an initial value may be selected for the reference voltage. In some cases, the initial value may be selected to be the reference voltage value currently being used for the memory cells. In some cases, the initial value may be close to Vcc or Vss. Other initial values may also be used.

After the first time (e.g., when 320 is entered from 340) through the first control operation, a new value may be selected for the reference voltage, different from the reference voltage value selected the previous time through the loop. In some cases, the new reference voltage may be selected based on the previous reference voltage. For example, as described herein, the new reference voltage may be incremented or decremented in steps each time through the loop. In some cases, the selectable reference voltage values may be stored by the memory array.

At 325, the memory cells corresponding to the data error may be read by the memory system using the reference voltage selected at 320. For example, as described with reference to FIG. 2, signals stored in the memory cells corresponding to the memory address may be received by a sense amplifier, which may compare the signals with the latest reference voltage selected at 320. For each memory cell, if the signal value is less than the selected reference voltage, the sense amplifier may determine that the memory cell represents a logic value '1'. Similarly, if the signal value is greater than the selected reference voltage, the sense amplifier may determine that the signal represents a logic value '0'. The memory cells to be read may be determined by information received in the command, e.g., a memory address value.

At 330, ECC decoder checking may be performed. For example, the data read by the memory system at 325 may have an ECC procedure applied. In some examples, to determine if the error remains in the data, the data read by the memory system at 325 may be compared with the data previously written to the memory cells. The previously written data to use for comparing may be reflected in the information received in the command.

At 335, if the error is no longer in the data as determined at 330, the error has been corrected and the method may be complete. In some cases, the error control operations associated with receiving the command may be ceased. For example, if the error is corrected using the first error control operation, the second error control operation (or other subsequent control operations), may not be initiated. The latest reference voltage used to read the memory cells at 325 may be used going forward. The reference voltage may be stored in memory or otherwise remembered for continued use in reading the memory cells. If the error remains in the data as determined at 330, the error has not been corrected, and the method may continue to 340.

At 340, the number of times the method has cycled through the first loop is determined. As noted above, the first loop may include steps 320 through 340 and may include reading the data each time and comparing it with the written data using a different reference voltage. If the number of times through the loop is equal to or less than a threshold number n, the method may return to 320 to repeat the first loop. If the number of times is greater than n, the method may continue to 345 to begin the second error control operation 310.

The second error control operation 310 may be an example of an auto read calibration operation that identifies likely voltage distributions associated with different logic states stored by the memory cells. Once the likely voltage distributions are identified, the second error control operation 310 may include selecting one or more reference voltages for read operations based on the identified voltage distributions. In some examples, the memory system may test a plurality of memory cells with a plurality of reference voltages. Using the information from multiple reads at multiple reference voltages, likely voltage distributions for other related memory cells of the memory system may be extrapolated.

At 345, a voltage distribution associated with the memory cells in which the data error has occurred may be determined. For example, as described with respect to FIG. 2, the voltage distributions of the memory cells may be analyzed to determine the valley between the voltage distribution levels. In one case, referring to FIG. 2, the voltage distributions 205 corresponding to logic value '1' and logic value '0' may be determined and the valley between the two identified.

Second error control operation 310 may include a second loop that includes one or more of steps 350 through 365. Each time through the second loop may include reading the data and comparing it with the written data using a specific reference voltage based on the voltage distribution. Step 350 may be an entrance to the second loop.

At 350, a reference voltage may be selected by the memory system based on the voltage distribution determined at 345. The first time through the second loop (e.g., when 350 is entered from 345), an initial value may be selected for the reference voltage, based on the voltage distribution. In some cases, the initial value may be selected to be a reference voltage value within the valley between the logic value '1' and logic value '0' voltage distributions. Other initial values may also be used.

After the first time (e.g., when 350 is entered from 365), a new value may be selected for the reference voltage, different from the reference voltage value selected the previous time through the second loop. In some cases, the new reference voltage may be selected based on the previous reference voltage. For example, as described herein, the new reference voltage may be incremented or decremented in steps each time through the loop. In some cases, the new reference voltage may be within the valley determined at 345.

At 355, the memory cells corresponding to the data error may be read by the memory system using the reference voltage selected at 350. For example, as described with reference to FIG. 2, signals stored in the memory cells may be received by a sense amplifier, which may compare the signals with the latest reference voltage selected at 320. For each memory cell, if the signal value is less than the selected reference voltage, the sense amplifier may determine that the memory cell represents a logic value '1'. Similarly, if the signal value is greater than the selected reference voltage, the sense amplifier may determine that the signal represents a logic value '0'. The memory cells to be read may be determined by information received in the command, e.g., a memory address value.

At 360, to determine if the error remains in the data, the data read by the memory system at 355 may be compared with the data previously written to the memory cells. The previously written data to use for comparing may be reflected in the information received in the command.

At 365, if the error remains in the data as determined at 360, the error has not been corrected, and the method may return to 350 to repeat the second loop. If the error is no longer in the data as determined at 360, the error has been corrected and the method may be complete. The latest reference voltage used to read the memory cells at 355 may be used going forward. The reference voltage may be stored in memory or otherwise remembered for continued use in reading the memory cells. In some cases, different instances of the second error control operation 310 may be initiated based on this determination. For example, different techniques may be used to determine voltage distributions or different starting reference voltages, activating or deactivating persistence, using information from a previous iteration of the second control operation 310 (or the first control operation 305) when selecting the reference voltage, or any combination thereof.

In some cases, method 300 may include further steps. For example, method 300 may include a further step in which the number of times the method has gone through the second loop is determined before returning to 350. If the number of times is equal to or less than a predetermined number m, the method may return to 350 to repeat the second loop. If the number of times is greater than m, the error has not been corrected and the memory cells may be disabled.

In some cases, at the completion of method 300, a message may be sent, e.g., to the host system. The message may include information about the data error correction, such as the corrected data, whether the error has been corrected, whether an error persists in the data, an indication that the data is corrupt, or other types of messages. In some cases, a message may be sent only if the error persists after completion of method 300.

Method 300 may provide distinct advantages when performing memory data correction. For example, the memory data correction may be performed using a single error control command. This may be beneficial for the host system because multiple commands may not be needed. As another example, the memory data correction may be requested without indicating which type of error control operation(s) to use. This may be beneficial for the memory system because it may allow the memory system to determine for itself which type of error control operation(s) to use and it may allow the memory system to continue using different types until the error is corrected. It may also be beneficial for the host system, because it may allow the host system to request a memory data correction from the memory system without the host system needing to direct the memory system to use a particular type of error control to use or keep track of the type. Other benefits may also be provided by using method 300.

Figure 4:
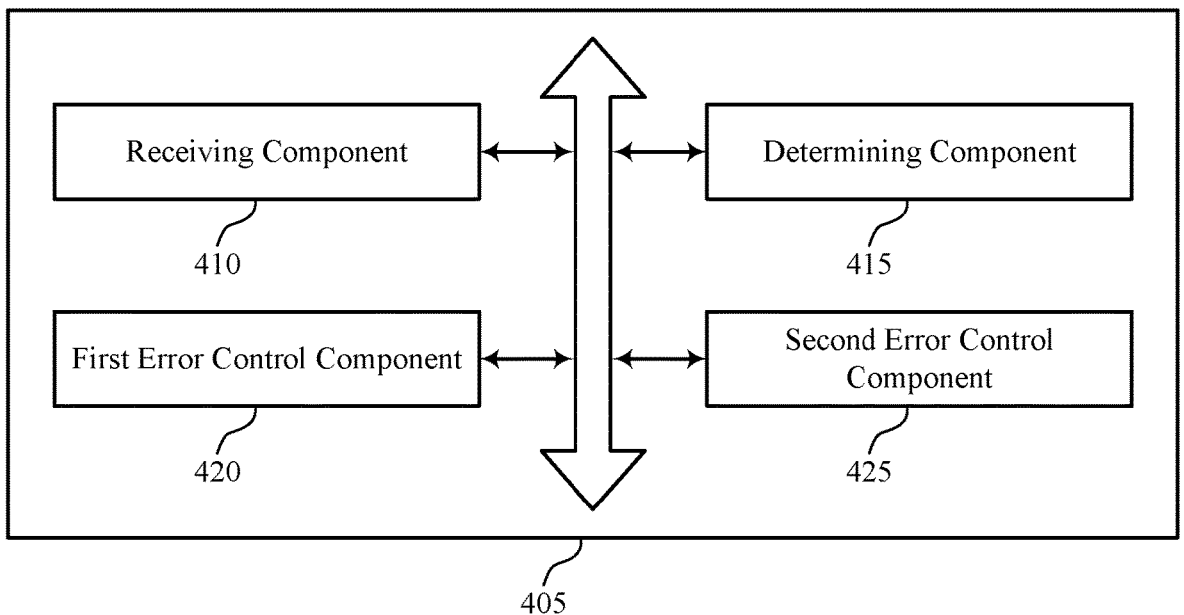
FIG. 4 shows a block diagram of a memory device that supports memory data correction using multiple error control operations in accordance with examples as disclosed herein.

FIG. 4 shows a block diagram 400 of a memory system 405 that supports memory data correction using multiple error control operations in accordance with examples as disclosed herein. The memory system 405 may be an example of aspects of a memory system or memory device as described with reference to FIGS. 1-3. The memory system 405 may include a receiving component 410, a determining component 415, a first error control component 420, and a second error control component 425. Each of these modules may communicate, directly or indirectly, with one another (e.g., via one or more buses).

The receiving component 410 may receive a command (e.g., a single command) to correct an error detected in data stored by a memory device. In some cases, the single command may include a single opcode associated with performing both a first error control operation and a second error control operation.

The determining component 415 may determine that an error remains in the data after performing a first error control operation. In some examples, the determining component 415 may determine that an error remains in the data after selecting a reference voltage to read the data.

The first error control component 420 may perform, based on receiving the single command, a first error control operation on the data stored by the memory device. The first error control operation may use one or more different reference voltages stored by a memory array to read the data. The one or more different reference voltages may include the first reference voltage and the previous reference voltage. In some examples, the first error control component 420 may compare a first reference voltage different than a previous reference voltage with signals output from memory cells of the memory device associated with the data. In some examples, the first error control component 420 may compare a set of reference voltages with signals output from memory cells of the memory device. In some examples, the first error control component 420 may identify data stored by the memory cells each time a different reference voltage is compared with the signals.

The second error control component 425 may perform, based on receiving the single command and determining that the error remains in the data, a second error control operation on the data stored by the memory device. The second error control operation may be different than the first error control operation. The second error control operation may use one or more voltage distributions associated with memory cells of the memory array that store information. In some examples, the second error control component 425 may identify the one or more voltage distributions associated with the memory cells of the memory device that store information. In some examples, the second error control component 425 may select a reference voltage to read the data stored by the memory device based on the one or more voltage distributions. In some examples, the second error control component 425 may select a second reference voltage different than the reference voltage to read the data stored by the memory device based on the one or more voltage distributions. In some examples, the second error control component 425 may analyze a data threshold distribution of memory cells of the memory device that are associated with the data. In some examples, the second error control component 425 may select, based on the one or more voltage distributions, different reference voltages to compare with the data stored by the memory device until the error is corrected in the data.

Figure 5:
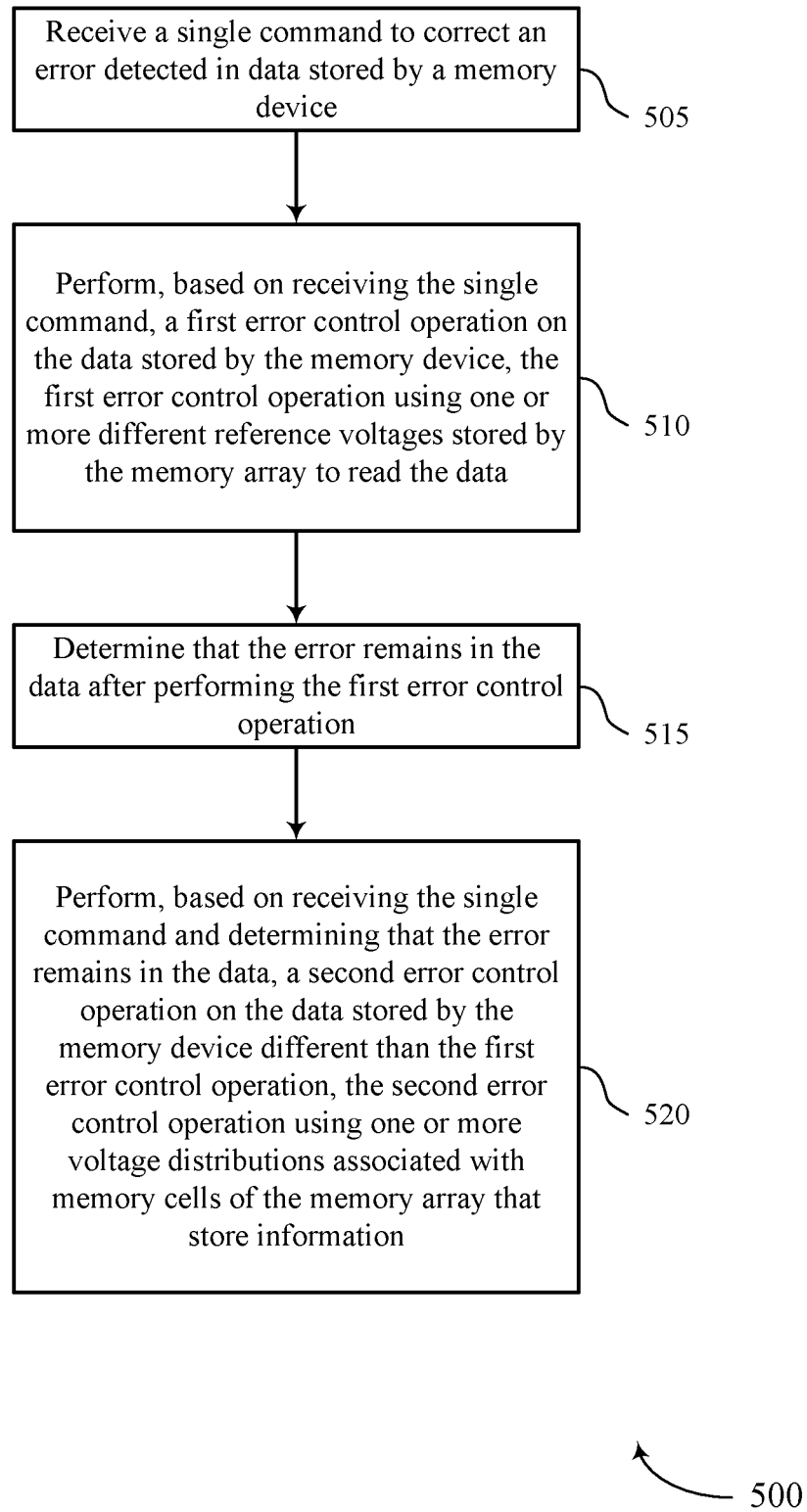
FIGS. 5 and 6 show flowcharts illustrating methods that support memory data correction using multiple error control operations in accordance with examples as disclosed herein.

FIG. 5 shows a flowchart illustrating a method 500 that supports memory data correction using multiple error control operations in accordance with examples as disclosed herein. The operations of method 500 may be implemented by a memory system or a memory device or its components as described herein. For example, the operations of method 500 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 505, a single command to correct an error detected in data stored by the memory device may be received. In some cases, the single command may be received by the memory device. The operations of 505 may be performed according to the methods described herein. In some examples, aspects of the operations of 505 may be performed by a receiving component as described with reference to FIG. 4.

At 510, a first error control operation on the data stored by the memory device may be performed based on receiving the single command. The first error control operation may use one or more different reference voltages stored by the memory array to read the data. The operations of 510 may be performed according to the methods described herein. In some examples, aspects of the operations of 510 may be performed by a first error control component as described with reference to FIG. 4.

At 515, it may be determined that the error remains in the data after performing the first error control operation. The operations of 515 may be performed according to the methods described herein. In some examples, aspects of the operations of 515 may be performed by a determining component as described with reference to FIG. 4.

At 520, a second error control operation on the data stored by the memory device may be performed based on receiving the single command and determining that the error remains in the data. The second error control operation may be different than the first error control operation and may use one or more voltage distributions associated with memory cells of the memory array that store information. The operations of 520 may be performed according to the methods described herein. In some examples, aspects of the operations of 520 may be performed by a second error control component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for receiving a single command to correct an error detected in data stored by a memory device, performing, based on receiving the single command, a first error control operation on the data stored by the memory device, the first error control operation using one or more different reference voltages stored by the memory array to read the data, determining that the error remains in the data after performing the first error control operation, and performing, based on receiving the single command and determining that the error remains in the data, a second error control operation on the data stored by the memory device different than the first error control operation, the second error control operation using one or more voltage distributions associated with memory cells of the memory array that store information.

In some examples of the method 500 and the apparatus described herein, performing the first error control operation may include operations, features, means, or instructions for comparing a first reference voltage different than a previous reference voltage with signals output from memory cells of the memory device associated with the data, where the one or more different reference voltages includes the first reference voltage and the previous reference voltage.

In some examples of the method 500 and the apparatus described herein, performing the first error control operation may include operations, features, means, or instructions for comparing a set of reference voltages with signals output from memory cells of the memory device, and identifying data stored by the memory cells each time a different reference voltage may be compared with the signals.

In some examples of the method 500 and the apparatus described herein, performing the second error control operation further may include operations, features, means, or instructions for identifying the one or more voltage distributions associated with the memory cells of the memory device that store information, and selecting a reference voltage to read the data stored by the memory device based on the one or more voltage distributions.

Some examples of the method 500 and the apparatus described herein may further include operations, features, means, or instructions for determining that the error remains in the data after selecting the reference voltage to read the data, and selecting a second reference voltage different than the reference voltage to read the data stored by the memory device based on the one or more voltage distributions.

In some examples of the method 500 and the apparatus described herein, performing the second error control operation may include operations, features, means, or instructions for analyzing a data threshold distribution of memory cells of the memory device that may be associated with the data, and selecting, based on the one or more voltage distributions, different reference voltages to compare with the data stored by the memory device until the error may be corrected in the data.

In some examples of the method 500 and the apparatus described herein, the single command may include a single opcode associated with performing both the first error control operation and the second error control operation.

Figure 6:
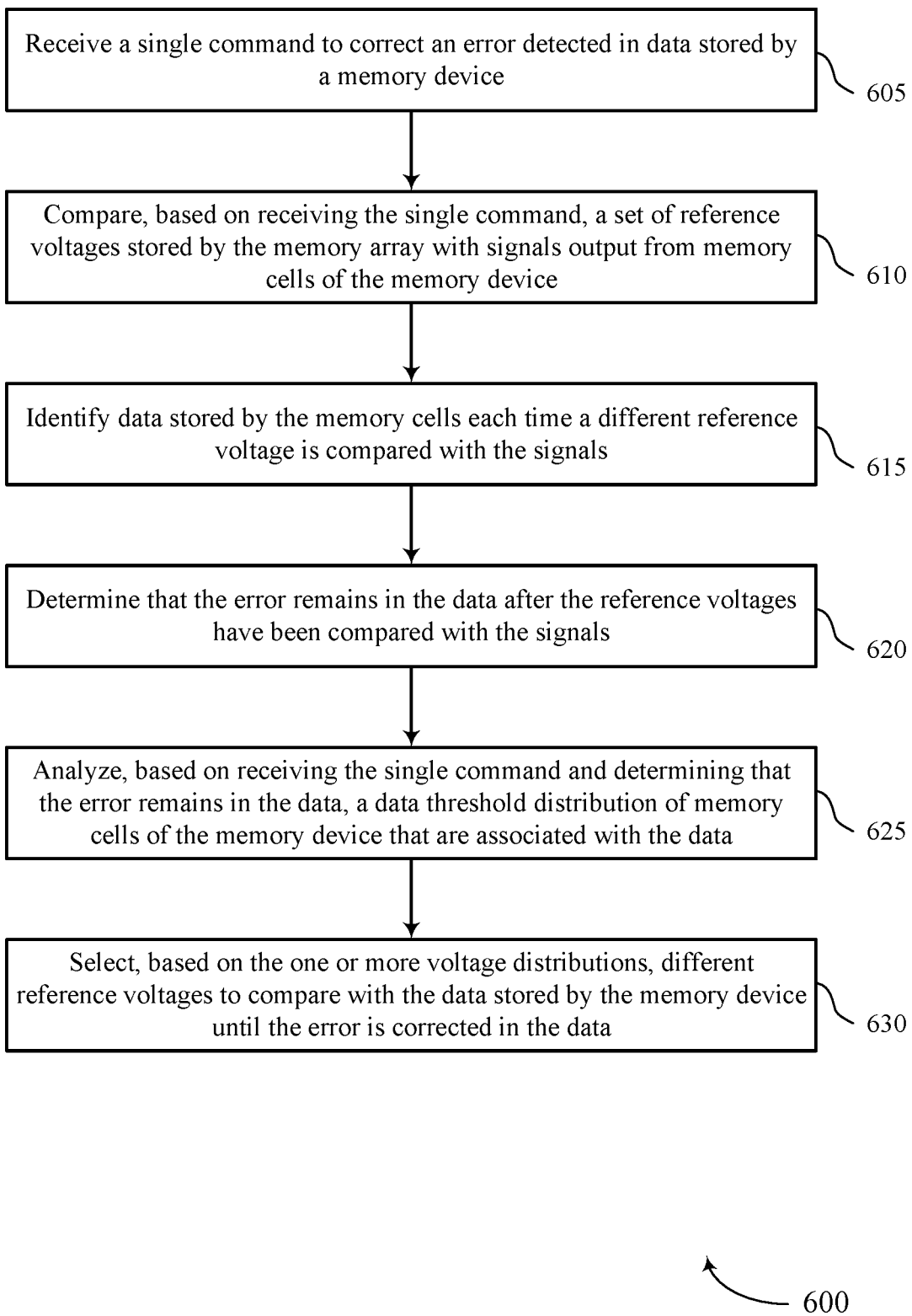

FIG. 6 shows a flowchart illustrating a method 600 that supports memory data correction using multiple error control operations in accordance with examples as disclosed herein. The operations of method 600 may be implemented by a memory device or its components as described herein. For example, the operations of method 600 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 605, a single command to correct an error detected in data stored by a memory device may be received. In some cases, the single command may be received by the memory device. The operations of 605 may be performed according to the methods described herein. In some examples, aspects of the operations of 605 may be performed by a receiving component as described with reference to FIG. 4.

At 610, a set of reference voltages stored by the memory array may be compared with signals output from memory cells of the memory device, based on receiving the single command. In some cases, the comparison may be performed by the memory device. The operations of 610 may be performed according to the methods described herein. In some examples, aspects of the operations of 610 may be performed by a first error control component as described with reference to FIG. 4.

At 615, data stored by the memory cells each time a different reference voltage is compared with the signals may be identified. In some cases, the identification may be performed by the memory device. The operations of 615 may be performed according to the methods described herein. In some examples, aspects of the operations of 615 may be performed by a first error control component as described with reference to FIG. 4.

At 620, it may be determined that the error remains in the data after the reference voltages have been compared with the signals. In some cases, the determination may be performed by the memory device. The operations of 620 may be performed according to the methods described herein. In some examples, aspects of the operations of 620 may be performed by a determining component as described with reference to FIG. 4.

At 625, a data threshold distribution of memory cells of the memory device that are associated with the data may be analyzed, based on receiving the single command and determining that the error remains in the data. In some cases, the analysis may be performed by the memory device. The operations of 625 may be performed according to the methods described herein. In some examples, aspects of the operations of 625 may be performed by a second error control component as described with reference to FIG. 4.

At 630, different reference voltages may be selected to compare with the data stored by the memory device until the error is corrected in the data, based on the one or more voltage distributions. The operations of 630 may be performed according to the methods described herein. In some examples, aspects of the operations of 630 may be performed by a second error control component as described with reference to FIG. 4.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory array, a controller coupled with the memory array and configured to cause the apparatus to perform, based on receiving the single command, a first error control operation on the data stored by the memory array, the first error control operation using one or more different reference voltages stored by the memory array to read the data, determine that the error remains in the data after performing the first error control operation, and perform, based on receiving the single command and determining that the error remains in the data, a second error control operation on the data stored by the memory array different than the first error control operation, the second error control operation using one or more voltage distributions associated with memory cells of the memory array that store information.

In some examples, performing the first error control operation may include operations, features, means, or instructions for comparing a first reference voltage different than a previous reference voltage with signals output from memory cells of the memory array associated with the data, where the one or more different reference voltages may include the first reference voltage and the previous reference voltage.

In some examples, performing the first error control operation may include operations, features, means, or instructions for comparing a set of reference voltages with signals output from memory cells of the memory array, and identifying data stored by the memory cells each time a different reference voltage may be compared with the signals.

In some examples, performing the second error control operation further may include operations, features, means, or instructions for identifying the one or more voltage distributions associated with the memory cells of the memory array that store information, and selecting a reference voltage to read the data stored by the memory array based on the one or more voltage distributions.

Some examples may further include determining that the error remains in the data after selecting the reference voltage to read the data, and selecting a second reference voltage different than the reference voltage to read the data stored by the memory array based on the one or more voltage distributions.

In some examples, performing the second error control operation may include operations, features, means, or instructions for analyzing a data threshold distribution of memory cells of the memory array that may be associated with the data, and selecting, based on the one or more voltage distributions, different reference voltages to compare with the data stored by the memory array until the error may be corrected in the data.

In some examples, the single command may include a single opcode associated with performing both the first error control operation and the second error control operation. In some examples, the first error control operation may include a read retry operation, and the second error control operation may include an auto read calibration operation. In some examples, the single command may be a read recovery command.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory array; and
   a controller coupled with the memory array and configured to cause the apparatus to:
     receive a single command to correct an error detected in data stored by the memory array;
     perform a first error control operation based at least in part on receiving the single command, the first error control operation comprising comparing a set of reference voltages stored by the memory array with signals output from a plurality of memory cells of the memory array to read data from the plurality of memory cells;
     determine that the error remains in the data after the set of reference voltages have been compared with the signals; and
     perform a second error control operation different from the first error control operation based at least in part on receiving the single command and determining that the error remains in the data, the second error control operation comprising:
       identifying one or more voltage distributions associated with the plurality of memory cells; and
       selecting, based on the one or more voltage distributions, a different reference voltage to compare with the data stored by the memory array.

2. The apparatus of claim 1, wherein the single command comprises a single opcode associated with performing both the first error control operation and the second error control operation.

3. The apparatus of claim 1, wherein the controller being configured to cause the apparatus to perform the second error control operation comprises the controller being configured to cause the apparatus to:
select subsequent different reference voltages based on the one or more voltage distributions until the error is corrected in the data.

4. The apparatus of claim 1, wherein the controller being configured to cause the apparatus to perform the second error control operation comprises the controller being configured to cause the apparatus to:
analyze a data threshold distribution of the plurality of memory cells associated with the data, wherein the different reference voltage to compare with the data stored by the memory array is based at least in part on the data threshold distribution of the plurality of memory cells.

5. The apparatus of claim 4, wherein the controller being configured to cause the apparatus to analyze the data threshold distribution of the plurality of memory cells associated with the data comprises the controller being configured to cause the apparatus to:
determine a valley region between two or more voltage distributions associated with the plurality of memory cells.

6. The apparatus of claim 1, wherein:
the first error control operation comprises a read retry operation; and
the second error control operation comprises an auto read calibration operation.

7. The apparatus of claim 1, wherein the single command includes an indication of a data value written to the plurality of memory cells.

8. The apparatus of claim 7, wherein the controller being configured to cause the apparatus determine that the error remains in the data after the set of reference voltages have been compared with the signals comprises the controller being configured to cause the apparatus to:
compare the data value written to the plurality of memory cells to the data read from the plurality of memory cells.

9. The apparatus of claim 1, wherein the plurality of memory cells comprise a plurality of single-level cell memory cells.

10. A method performed by a memory system, the method comprising:
receiving a single command to correct an error detected in data stored by a memory array;
performing a first error control operation based at least in part on receiving the single command, the first error control operation comprising comparing a set of reference voltages stored by the memory array with signals output from a plurality of memory cells of the memory array to read data from the plurality of memory cells;
determining that the error remains in the data after the set of reference voltages have been compared with the signals; and
performing a second error control operation different from the first error control operation based at least in part on receiving the single command and determining that the error remains in the data, the second error control operation comprising:
identifying one or more voltage distributions associated with the plurality of memory cells; and
selecting, based on the one or more voltage distributions, a different reference voltage to compare with the data stored by the memory array.

11. The method of claim 10, wherein the single command comprises a single opcode associated with performing both the first error control operation and the second error control operation.

12. The method of claim 10, wherein performing the second error control operation comprises:
selecting subsequent different reference voltages based on the one or more voltage distributions until the error is corrected in the data.

13. The method of claim 10, wherein performing the second error control operation comprises:
analyzing a data threshold distribution of the plurality of memory cells associated with the data, wherein the different reference voltage to compare with the data stored by the memory array is based at least in part on the data threshold distribution of the plurality of memory cells.

14. The method of claim 13, wherein analyzing the data threshold distribution of the plurality of memory cells associated with the data comprises:
determining a valley region between two or more voltage distributions associated with the plurality of memory cells.

15. The method of claim 10, wherein:
the first error control operation comprises a read retry operation; and
the second error control operation comprises an auto read calibration operation.

16. The method of claim 10, wherein the single command includes an indication of a data value written to the plurality of memory cells.

17. The method of claim 16, wherein determining that the error remains in the data after the set of reference voltages have been compared with the signals comprises:
comparing the data value written to the plurality of memory cells to the data read from the plurality of memory cells.

18. The method of claim 10, wherein the plurality of memory cells comprise a plurality of single-level cell memory cells.

19. A non-transitory computer-readable medium storing code comprising instructions which, when executed by a processor of an electronic device, cause the electronic device to:
receive a single command to correct an error detected in data stored by a memory array;
perform a first error control operation based at least in part on receiving the single command, the first error control operation comprising comparing a set of reference voltages stored by the memory array with signals output from a plurality of memory cells of the memory array to read data from the plurality of memory cells;
determine that the error remains in the data after the set of reference voltages have been compared with the signals; and
perform a second error control operation different from the first error control operation based at least in part on receiving the single command and determining that the error remains in the data, the second error control operation comprising:
identifying one or more voltage distributions associated with the plurality of memory cells; and selecting, based on the one or more voltage distributions, a different reference voltage to compare with the data stored by the memory array.

20. The non-transitory computer-readable medium of claim 19, wherein the single command comprises a single opcode associated with performing both the first error control operation and the second error control operation.

* * * * *